United States Patent [19]
Lee et al.

[11] Patent Number: 5,893,731
[45] Date of Patent: Apr. 13, 1999

[54] METHOD FOR FABRICATING LOW COST INTEGRATED RESISTOR CAPACITOR COMBINATIONS

[75] Inventors: Chang-Shu Lee; Tsung-Yao Chu, both of Hsinchu, Taiwan

[73] Assignee: Industrial Technology Research Institute, Hsin-chu, Taiwan

[21] Appl. No.: 08/862,796

[22] Filed: May 23, 1997

[51] Int. Cl.$^6$ .............................................. H01L 21/8234
[52] U.S. Cl. .................... 438/238; 438/240; 438/253; 438/381; 438/382; 438/396; 438/466
[58] Field of Search .................... 438/466, 238, 438/240, 253, 381, 382, 396

[56] References Cited

U.S. PATENT DOCUMENTS

| | | | |
|---|---|---|---|
| 4,251,326 | 2/1981 | Arcidiacono et al. | 204/15 |
| 4,410,867 | 10/1983 | Arcidiacono et al. | 333/172 |
| 4,766,093 | 8/1988 | Hovel et al. | 438/669 |
| 4,781,802 | 11/1988 | Fresia | 204/37.1 |
| 5,422,293 | 6/1995 | Konya | 437/50 |
| 5,474,948 | 12/1995 | Yamazaki | 438/238 |
| 5,541,442 | 7/1996 | Keil et al. | 257/533 |
| 5,554,558 | 9/1996 | Hsu et al. | 438/253 |
| 5,583,068 | 12/1996 | Jones, Jr. et al. | 437/52 |
| 5,759,887 | 6/1998 | Ito et al. | 438/238 |

*Primary Examiner*—John F. Niebling
*Assistant Examiner*—Lynne A. Gurley
*Attorney, Agent, or Firm*—George O. Saile; Stephen B Ackerman; Larry J. Prescott

[57] ABSTRACT

A low cost method for forming an integrated resistor capacitor combination using only three masks and three mask exposure steps is described. A layer of resistor material is formed on a substrate and patterned forming a resistor and a first capacitor plate. A photoresist mask is then formed covering the resistor and a contact region of the first capacitor plate. The substrate is then immersed in an anodization solution and that part of the first capacitor plate not covered by the photoresist mask is anodized forming a capacitor dielectric. The photoresist mask is then stripped. A layer of conductor material is then formed and patterned to form contacts to the resistor, a contact to the first capacitor plate, and a second capacitor plate.

28 Claims, 6 Drawing Sheets

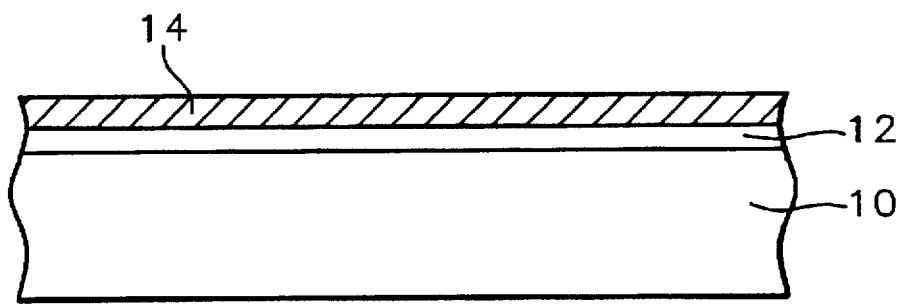
FIG. 1A - Prior Art
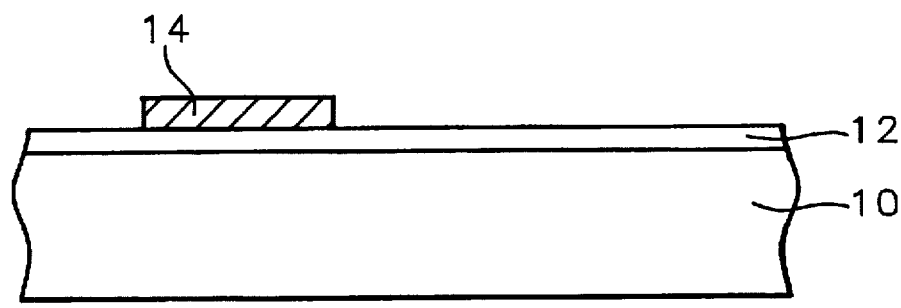
FIG. 1B - Prior Art
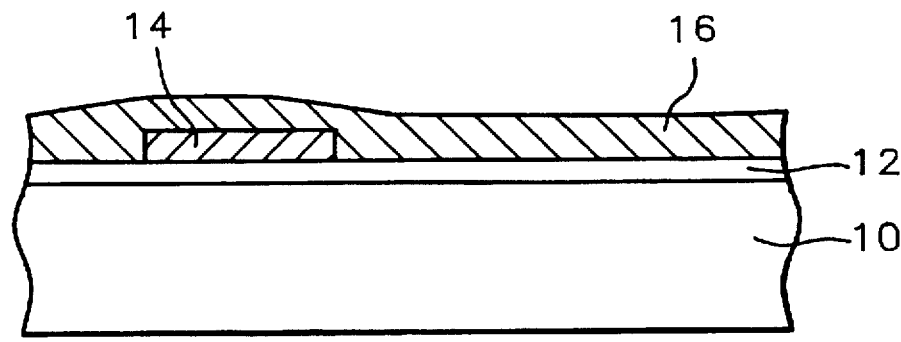
FIG. 2A - Prior Art

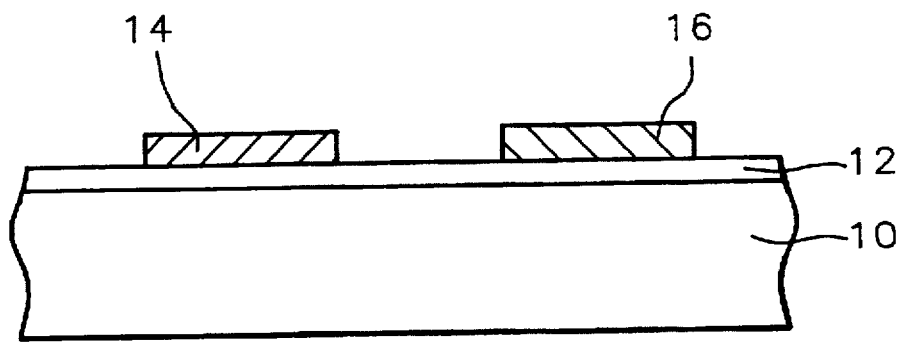
FIG. 2B - Prior Art
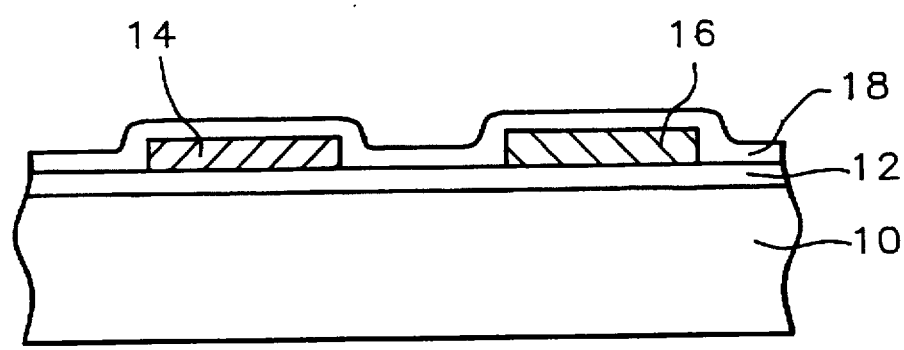
FIG. 3A - Prior Art
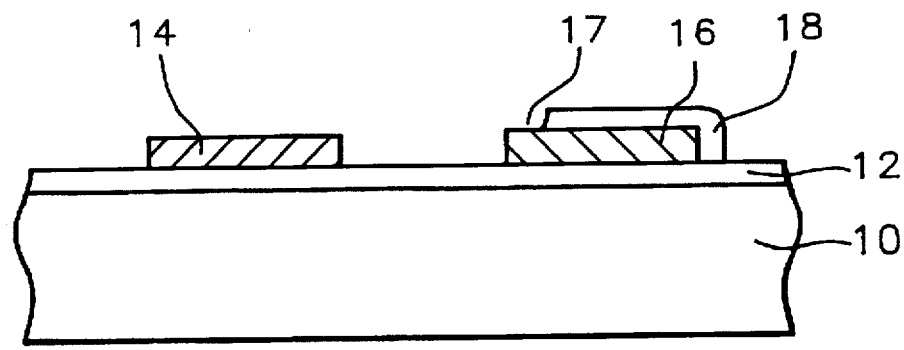
FIG. 3B - Prior Art

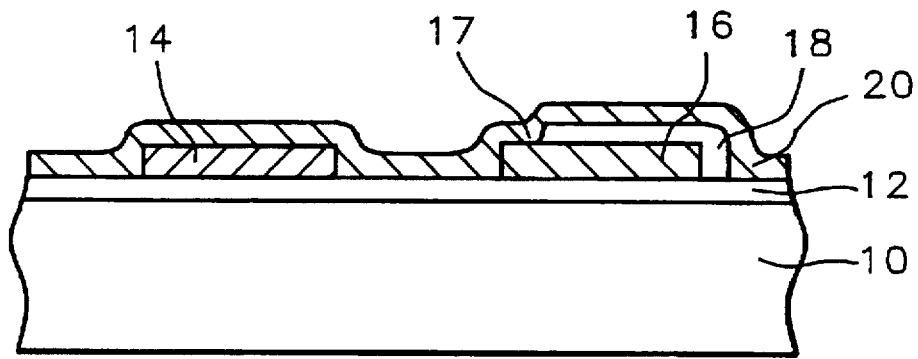
*FIG. 4A - Prior Art*
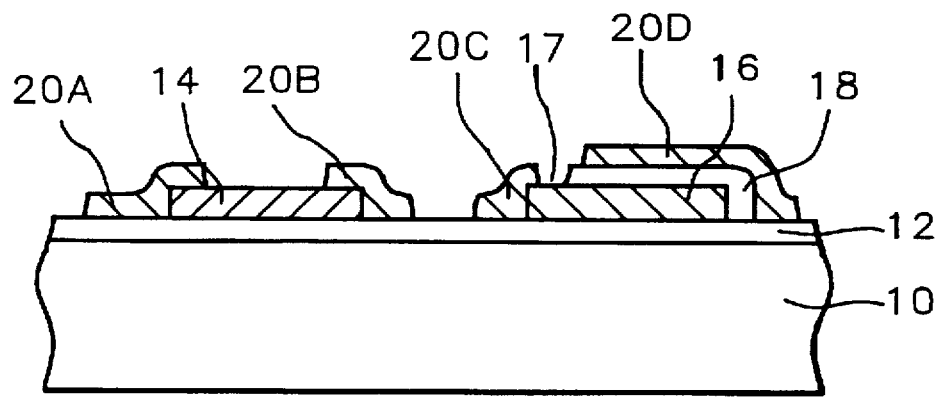
*FIG. 4B - Prior Art*

METHOD FOR FABRICATING LOW COST INTEGRATED RESISTOR CAPACITOR COMBINATIONS

BACKGROUND OF THE INVENTION (1) Field of the Invention

This invention relates to the formation of a low cost integrated resistor capacitor combination and more specifically to the use of anodization to form a capacitor dielectric thereby reducing the number of mask steps required.

(2) Description of the Related Art

U.S. Pat. No. 4,781,802 to Fresia describes the anodization of porous tantalum pellets under various anodization and heat treatment conditions to improve the dielectric oxide.

U.S. Pat. No. 5,541,442 to Keil et al. describes a capacitor configuration using FET technology. The diffusion zone of the substrate is used as one plate of the capacitor and the gate electrode of an FET is the other plate the two plates being separated by a conventional thin dielectric gate oxide layer.

U.S. Pat. No. 5,422,293 to Konya shows a method for forming resistors and capacitors. Oxide films are formed on the surfaces of the gate line and the capacitor lines by anodization to prevent shorting of these lines.

U.S. Pat. No. 5,583,068 to Jones, Jr. et al. describes a method of forming a capacitor with a metal-oxide dielectric layer.

U.S. Pat. No. 4,251,326 to Arcidiacono et al. and U.S. Pat. No. 4,410,867 to Arcidiacono et al. describe a method of forming a thin film resistor capacitor network. A film of alpha titanium is deposited and anodized to form bottom capacitor plates and a capacitor dielectric. A film of titanium nitride is later deposited to form resistors.

The present invention describes a method of forming an integrated resistor capacitor combination using a layer of resistor material patterned to form resistors and first capacitor plates. A capacitor dielectric is then formed on the first capacitor plates using anodization. An overlaying conductor layer is then patterned to form resistor contacts, contacts to the first capacitor plates, and second capacitor plates.

SUMMARY OF THE INVENTION

Integrated resistor and capacitor combinations find widespread use in micro electronic circuits and low cost methods for fabrication of the resistor capacitor combinations are important in the micro electronics industry. A conventional method of fabrication of an integrated resistor capacitor combination is shown in FIGS. 1A–4B.

As shown in FIG. 1A, a layer of pad dielectric 12, such as silicon dioxide, is formed on a silicon substrate 10. A layer of resistor material 14, such as $Ta_2N$, is formed on the layer of pad dielectric 12. As shown in FIG. 1B, the layer of resistor material 14 is then patterned, using photolithographic processing, to form the resistor of the integrated resistor capacitor combination. Next, as shown in FIG. 2A, a layer of first conducting material 16, such as aluminum, is formed over the substrate. As shown in FIG. 2B, the layer of first conducting material 16 is then patterned, using photolithographic processing, to form the first capacitor plate.

As shown in FIG. 3A, a layer of capacitor dielectric material 18, such as $SiO_2$, is then formed over the patterned resistor material 14 and the first capacitor plate. As shown in FIG. 3B, the capacitor dielectric material 18 is then patterned so that the dielectric material 18 covers the first capacitor plate 16 leaving a contact 17 region exposed for contacting the first capacitor plate. As shown in FIG. 4A a layer of second conductor material 20, such as aluminum, is then formed on the substrate. The layer of second contact material is then patterned to form resistor contacts, 20A and 20B, a contact to the first capacitor plate 20C, and a second capacitor plate 20D thereby completing the capacitor of the integrated resistor capacitor combination.

As can be readily seen from the preceding description the conventional method of forming the integrated resistor capacitor combination requires at least four different masks and masking steps, patterning the layer of resistor material, patterning the layer of first conductor material, patterning the capacitor dielectric layer, and patterning the second conductor layer.

It is an objective of this invention to provide a simple and low cost method of forming an integrated resistor capacitor combination requiring no more than three different masks and masking steps.

This objective is achieved by forming both the resistor and the first capacitor plate from a layer of resistor material, such as $Ta_2N$. A portion of the first capacitor plate is then anodized to form a capacitor dielectric. A layer of conductor material is then formed and patterned to form the resistor contacts, the contact to the first capacitor plate, and the second capacitor plate. This method requires three masks and masking steps, patterning the layer of resistor material, forming a photoresist mask for the anodization, and patterning the conductor layer.

BRIEF DESCRIPTION OF THE DRAWINGS

FIGS. 1A–4B show the process steps for forming an integrated resistor capacitor combination using a conventional method.

DESCRIPTION OF THE PREFERRED EMBODIMENTS

Figure 5:
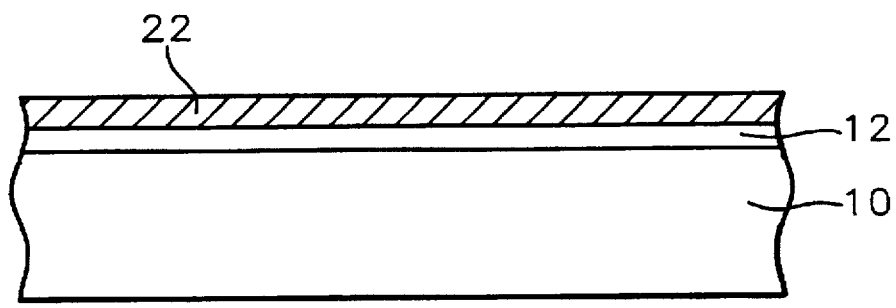
FIG. 5 shows a cross section of a substrate with a layer of pad dielectric and a layer of resistor material formed thereon.
Figure 6:
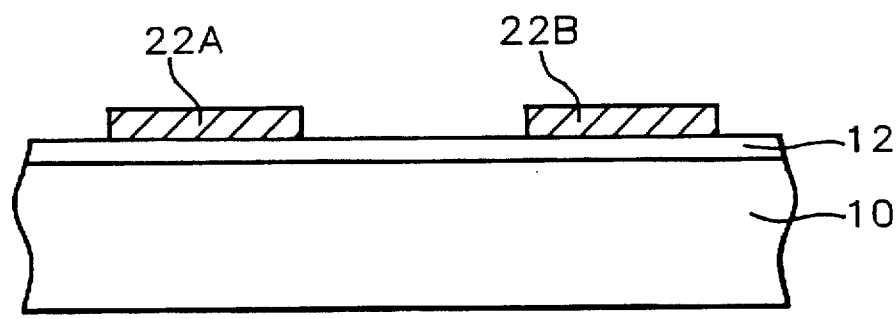
FIG. 6 shows a cross section view of the substrate after the layer of resistor material has been patterned to form a resistor and a first capacitor plate.

Refer now to FIGS. 5–11 for a description of a preferred embodiment of the method of this invention. FIG. 5 shows a cross section view of a substrate 10, such as a silicon substrate, on which the integrated resistor capacitor combination will be formed. The substrate 10 can be an integrated circuit wafer with devices formed therein or can be a substrate without devices. A layer of pad dielectric 12, such as silicon dioxide, is formed on the substrate 10 and a layer of resistor material 22 is formed on the layer of pad dielectric 12. In this example the resistor material is tantalum nitride, $Ta_2N$, formed by sputtering and having a thickness of between about 2000 and 2500 Angstroms. The layer of resistor material can be materials such as $Ti_2N$, $W_2N$, AlN, TaAl, TaTi, TaSi, or polysilicon. As shown in FIG. 6 the layer of resistor material is patterned to form a resistor 22A and a first capacitor plate 22B. The layer of resistor material is patterned using photolithographic processing and requires one mask and one mask exposure step.

Figure 7:
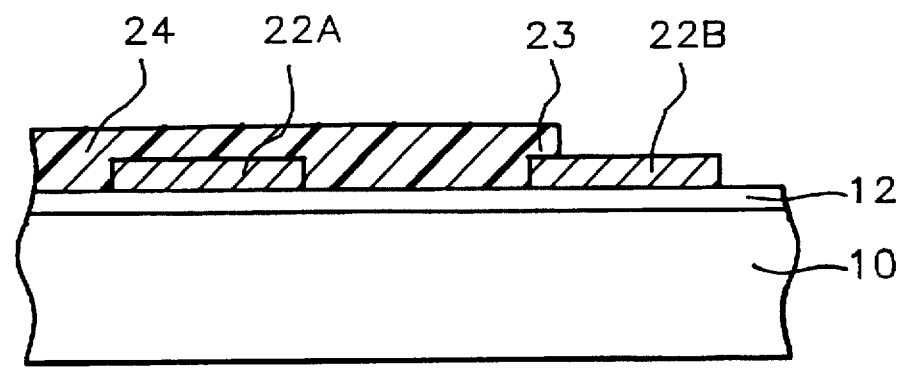
FIG. 7 shows a cross section view of the substrate after a layer of photoresist has been formed over the patterned layer of resistor material, exposed and developed.

Next, as shown in FIG. 7, a layer of photoresist is formed over the resistor 22A and first capacitor plate 22B, exposed and developed thereby forming a photoresist mask 24 which covers the resistor 22A and the contact region 23 of the first capacitor plate. The first capacitor plate 22B is made up of a contact region 23, where electrical contact will be made, and a capacitor region, which is the remainder of the first capacitor plate. The formation of the photoresist mask 24 requires a second mask and a second mask exposure step.

Figure 8:
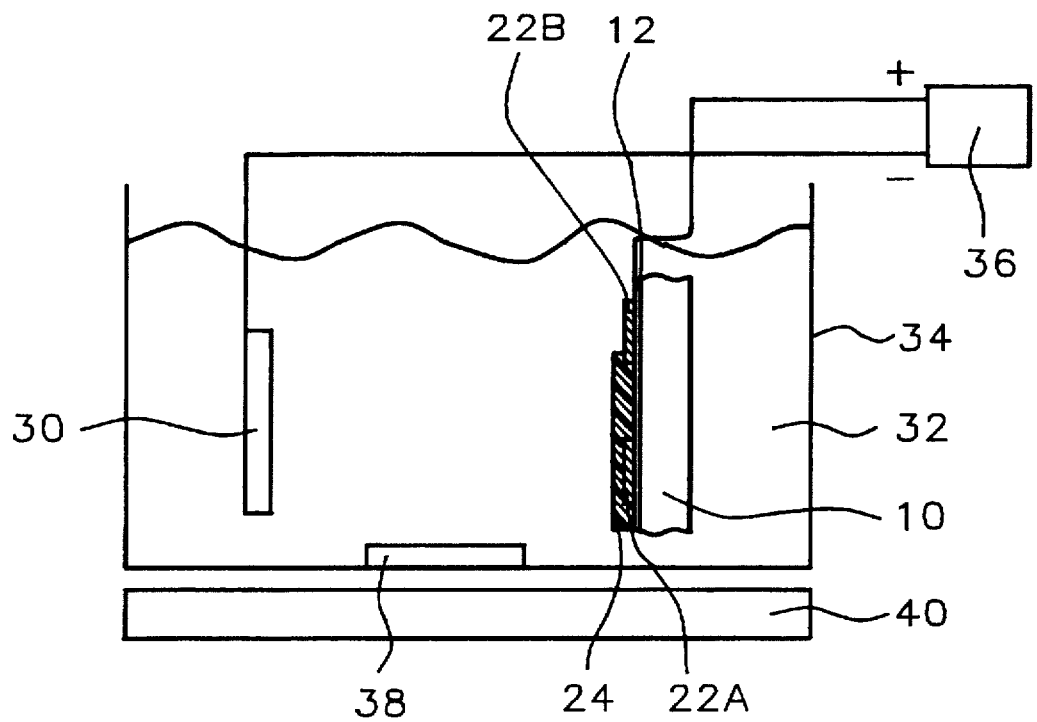
FIG. 8 shows a diagrammatic view of an anodization apparatus used to anodize the first capacitor plate.

Next, as shown in FIG. 8, the substrate 10 is immersed in an anodization solution 32 which has been placed in an anodization chamber 34. An anodization cathode 30 is also placed in the anodization solution 32. An direct current power supply 36 supplies the voltage for the anodization process. The positive terminal of the direct current power supply 36 is connected to the first capacitor plate 22B and the negative terminal of the direct current power supply is connected to the cathode 30. Only one resistor and one first capacitor plate are shown however it will be readily apparent to those skilled in the art that there can be a number of resistors and a number of first capacitor plates. In this case the first capacitor plates are all connected in common to the positive terminal of the direct current power supply to form the anode for the anodization process. The cathode 30 in this example is carbon. A stirring machine 40 activates a stirring mechanism 38 located in the anodization solution 32 to stir the anodization solution during the anodization process. In this example the anodization solution is between about 0.3 and 0.5 volume per cent $H_2C_2O_4$, preferably 0.4 volume percent.

The direct current power supply 36 supplies an anodization voltage of between about 40 and 80 volts for an anodization time of between about 4 and 35 minutes. During the anodization time the resistor material in the first capacitor plate which is exposed to the anodization solution is anodized. In this example the $Ta_2N$ in the first capacitor plate exposed to the $H_2C_2O_4$ anodization solution forms a layer of $Ta_2O_5$ during the anodization process.

Figure 9:
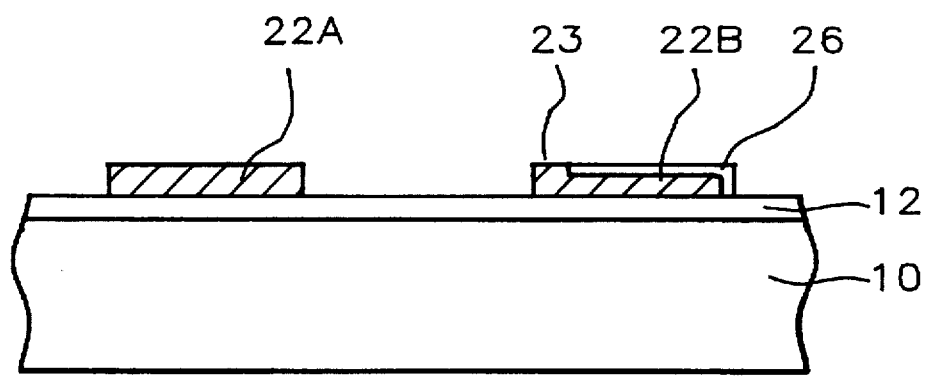
FIG. 9 shows a cross section view of the substrate after the first capacitor plate has been anodized.

Next, as shown in FIG. 9, the substrate is removed from the anodization solution and the photoresist mask is stripped. A capacitor dielectric 26, in this example $Ta_2O_5$, has been formed on the capacitor region of the first capacitor plate 22B but not on the contact region 23 of the first capacitor plate.

Figure 10:
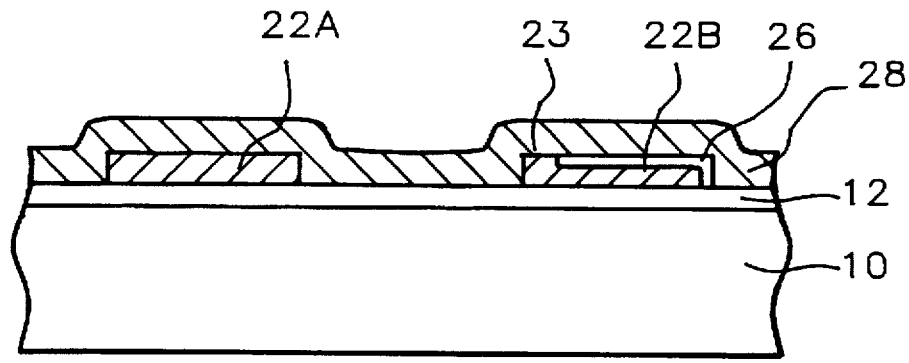
FIG. 10 shows a cross section view of the substrate after a layer of conducting material has been formed over the patterned resistor and anodized first capacitor plate.
Figure 11:
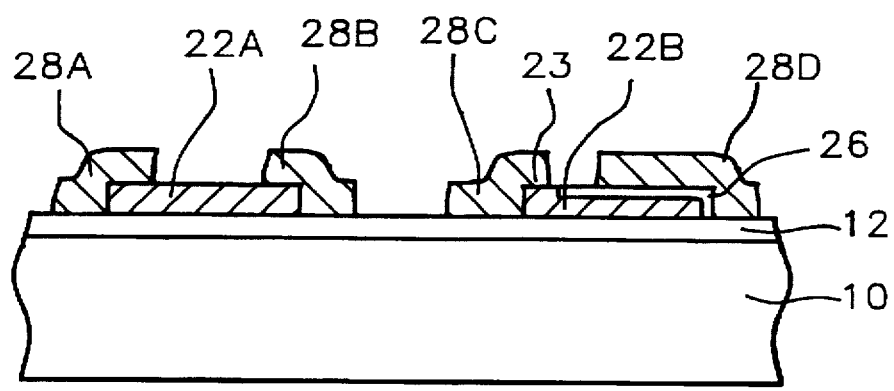
FIG. 11 shows a cross section view of the substrate after the layer of conducting material has been patterned.

Next, as shown in FIG. 10, a layer of conducting material 28, such as aluminum, is formed over the resistor 22A and the anodized first capacitor plate 22B. Next, as shown in FIG. 11 the layer of conductor material is patterned using a third mask, a third mask exposure step, and standard photolithographic processing. The patterned layer of conductor material forms contacts, 28A and 28B, to the resistor 22A, a contact 28C to the contact region 23 of the first capacitor plate 22B, and a second capacitor plate 28D, thereby completing the formation of the integrated resistor capacitor combination. Only three masks and mask exposure steps are required.

For anodization times of about 5 minutes using an anodization voltage of about 75 volts capacitors having a capacitance of about 43 microfarads/$cm^2$ and a breakdown voltage of about 40 volts have been achieved. For anodization times of about 30 minutes using an anodization voltage of about 50 volts capacitors having a capacitance of about 80 microfarads/$cm^2$ and a breakdown voltage of about 24 volts have been achieved. For a layer of $Ta_2N$ resistor material, formed by sputtering and having a thickness of about 2000 Angstroms, sheet resistance of about 25 ohms per square and a temperature coefficient of resistance of about $-120$ ppm/° C. have been achieved.

This description has described the formation of one resistor and one capacitor plate. It will be readily apparent to those skilled in the art that a number of resistors and a number of capacitors can be formed simultaneously.

While the invention has been particularly shown and described with reference to the preferred embodiments thereof, it will be understood by those skilled in the art that various changes in form and details may be made without departing from the spirit and scope of the invention.

What is claimed is:

1. A method of forming an integrated resistor and capacitor, comprising the steps of:

providing a substrate having a layer of dielectric formed thereon;

forming a layer of resistor material on said layer of dielectric;

patterning said layer of resistor material thereby simultaneously forming a number of resistors and a number of first capacitor plates wherein each said first capacitor plate has a capacitor region and a contact region;

anodizing said capacitor region of each of said first capacitor plates thereby forming a capacitor dielectric on said capacitor region of each of said first capacitor plates;

forming a layer of conductor material over said substrate wherein said layer of conductor material covers said resistors and said anodized first capacitor plates; and patterning said layer of conductor material thereby forming a second capacitor plate over said capacitor dielectric on said capacitor region of each of said first capacitor plates, a first electrical contact to each of said resistors, a second electrical contact to each of said resistors, and an electrical contact to said contact region of each of said first capacitor plates.

2. The method of claim 1 wherein said patterning said layer of resistor material uses photolithography with a single mask and a single mask exposure step.

3. The method of claim 1 wherein said anodizing said capacitor region of each of said first capacitor plates further comprises:

forming a layer of photoresist over said patterned layer of resistor material;

patterning said layer of photoresist thereby removing said photoresist from said capacitor region of each of said first capacitor plates;

placing said substrate in an anodization solution with an anodization cathode wherein said capacitor region of each of said first capacitor plates collectively form an anodization anode;

establishing an anodization voltage between said anodization anode and said anodization cathode for an anodization time;

removing said substrate from said anodization solution; and removing said patterned layer of photoresist.

4. The method of claim 3 wherein said patterning said layer of photoresist uses a single mask and a single mask exposure step.

5. The method of claim 1 wherein said patterning said layer of conductor material uses photolithography with a single mask and a single mask exposure step.

6. The method of claim 1 wherein said resistor material is $Ta_2N$.

7. The method of claim 6 wherein said anodization solution is between about 0.3 and 0.5 volume percent $H_2C_2O_4$.

8. The method of claim 6 wherein said capacitor dielectric is $Ta_2O_5$.

9. The method of claim 1 wherein said resistor material is $Ti_2N$.

10. The method of claim 1 wherein said resistor material is $W_2N$.

11. The method of claim 1 wherein said resistor material is AlN.

12. The method of claim 1 wherein said resistor material is TaAl, TaTi, or TaSi.

13. The method of claim 1 wherein said anodization voltage is between about 40 and 80 volts.

14. The method of claim 1 wherein said anodization time is between about 4 and 35 minutes.

15. The method of claim 1 wherein said conductor material is aluminum.

16. The method of claim 1 wherein said substrate is a silicon substrate.

17. A method of forming an integrated resistor and capacitor, comprising the steps of:

providing a substrate having a layer of dielectric formed thereon;

forming a layer of resistor material on said layer of dielectric;

patterning said layer of resistor material using photolithography with a single mask and a single masking step thereby forming a number of resistors and a number of first capacitor plates wherein each said first capacitor plate has a capacitor region and a contact region;

forming a layer of photoresist over said patterned layer of resistor material;

patterning said layer of photoresist using a single mask and a single mask exposure step thereby removing said photoresist from said capacitor region of each of said first capacitor plates;

placing said substrate in an anodization solution with an anodization cathode wherein said capacitor region of each of said first capacitor plates collectively form an anodization anode;

establishing an anodization voltage between said anodization anode and said anodization cathode for an anodization time thereby anodizing said capacitor region of each of said first capacitor plates and forming a capacitor dielectric on said capacitor region of each of said first capacitor plates;

removing said substrate from said anodization solution;

removing said patterned layer of photoresist;

forming a layer of conductor material over said substrate wherein said layer of conductor material covers said resistors and said anodized first capacitor plates; and patterning said layer of conductor material using photolithography with a single mask and a single masking step thereby forming a second capacitor plate over said capacitor dielectric on each said first capacitor plate, a first electrical contact to each of said resistors, a second electrical contact to each of said resistors, and an electrical contact to each of said first capacitor plates.

18. The method of claim 17 wherein said resistor material is $Ta_2N$.

19. The method of claim 17 wherein said anodization solution is between about 0.3 and 0.5 volume percent $H_2C_2O_4$.

20. The method of claim 17 wherein said capacitor dielectric is $Ta_2O_5$.

21. The method of claim 17 wherein said resistor material is $Ti_2N$.

22. The method of claim 17 wherein said resistor material is $W_2N$.

23. The method of claim 17 wherein said resistor material is AlN.

24. The method of claim 17 wherein said resistor material is TaAl, TaTi, or TaSi.

25. The method of claim 17 wherein said anodization voltage is between about 40 and 80 volts.

26. The method of claim 17 wherein said anodization time is between about 4 and 35 minutes.

27. The method of claim 17 wherein said conductor material is aluminum.

28. The method of claim 17 wherein said substrate is a silicon substrate.

* * * * *